United States Patent [19]

Ohnuma et al.

[11] 4,079,440
[45] Mar. 14, 1978

[54] PRINTED CIRCUIT BOARD CAPABLE OF BEING INSERTED AND WITHDRAWN ON ON-LINE STATUS

[75] Inventors: Kunihiko Ohnuma, Hitachi; Hajime Yasuda, Katsuta, both of Japan

[73] Assignee: Hitachi, Ltd., Japan

[21] Appl. No.: 760,523

[22] Filed: Jan. 19, 1977

[51] Int. Cl.² .............................................. H05K 1/04
[52] U.S. Cl. .................................. 361/424; 361/409; 361/413
[58] Field of Search ............... 361/409, 413, 414, 424; 339/14 R; 333/84 M

[56] References Cited

U.S. PATENT DOCUMENTS

| | | |
|---|---|---|
| 3,832,602 | 8/1974 | Engelhard et al. ................ 361/409 |
| 3,973,817 | 8/1976 | Stalley et al. ...................... 361/409 |
| 3,992,686 | 11/1976 | Canning ............................ 361/413 |
| 3,993,935 | 11/1976 | Phillips et al. ..................... 361/413 |

*Primary Examiner*—David Smith, Jr.
*Attorney, Agent, or Firm*—Craig & Antonelli

[57] ABSTRACT

Disclosed is a printed circuit board loaded with electronic circuits, the board having at least two connector plugs for power supply, one is relatively long while the other is relatively short. These connector plugs are connected to each other through an impedance element. During an insertion of the board to a power line, the longer connector plug gets in contact with the power line earlier than the shorter one, while, during the withdrawal of the board from the line, the longer connector plug leaves the line later than the shorter one.

6 Claims, 7 Drawing Figures

PRINTED CIRCUIT BOARD CAPABLE OF BEING INSERTED AND WITHDRAWN ON ON-LINE STATUS

BACKGROUND OF THE INVENTION

The present invention is concerned with an insertion-and-withdrawal on ON-LINE status of a printed circuit board loaded with electronic circuits, i.e., with insertion and withdrawal of a printed circuit board to and from a connector without disconnecting an electric source from which the connector is supplied with an electric power.

Systems have been known for performing a transmission of data between a computor and periperal equipments such as input and output means, the input and the output means consist of one or more printed circuit boards each of which being loaded with a concentrated control circuit and connected through a connector, in parallel with each other, to a bus line on a mother board for transmitting the data.

It is a common measure, in these systems, to operate a plurality of printed circuit boards of the input and output means with a single and common power supply. Thus, an insertion or a withdrawal of one printed circuit board, for the purpose of addition or maintenance, inevitably causes a disturbance of signals on the bus line, as well as a fluctuation of the power voltage, which in turn affects badly other printed circuit boards connected to the same bus-line, when the insertion or the withdrawal is made on ON-LINE status, i.e., without disconnecting the power source.

For this reason, conventionally, insertion and withdrawal of a printed circuit board has required to disconnect the power source.

Recent progress of packaging technology has produced highly centralized circuits such as LSI, which in turn affords a system in which a number of input and output means are mounted in a unit and operated with a single and common power source. In order to avoid aformentioned disturbance of signals, it has recently been proposed to provide each circuit board with a disconnecting switch through which the circuit is connected to a common line. However, the addition of switches for the printed circuit boards considerably deteriorates the packaging and mounting technology, and causes an unduly raised cost of production, and, therefore, is almost impracticable.

SUMMARY OF THE INVENTION

It is therefore an object of the present invention to provide a printed circuit board which can be freely inserted and withdrawn to and from a common bus-line of signal on ON-LINE status, without badly affecting other printed circuit boards which are connected to the bus line.

It is another object of the present invention to provide a printed circuit board having a simplified structure which affords the insertion and withdrawal on ON-LINE state.

It is still another object of the invention to provide a printed circuit board adapted for an easier handling as well as a simple insertion and withdrawal.

According to one aspect of the invention, there is provided a printed circuit board having two connector plugs, one being longer than the other, the longer connector plug being electrically connected to the shorter connector plug through an impedance, while the shorter connector plug being connected to an electronic circuit with which the board is loaded, through an inductance, for supplying the power to the circuit.

According to another aspect of the present invention, the longer and the shorter connector plugs are connected to each other through a capacitor, thereby to decrease a fluctuation of the power source voltage attributable the withdrawal of the printed circuit board.

In still another aspect of the invention, a printed circuit board can have a grounding terminal and a locking terminal which are adapted to be electrically connected to ground at the time of the withdrawal of the printed circuit board.

In a further aspect of the invention, a printed circuit board has an open collector through which an output-control signal is applied to a gate of the final stage for data-outputting, while the output terminal of the open-collector gate is connected to a locking terminal through a diode.

In a still further aspect of the invention, a reset line of the electronic circuit is connected to a locking terminal through a diode.

In a still further aspect of the invention, a printed circuit board can have a grounding terminal and a locking terminal which are adapted to be connected to the ground being gripped by a conductive grip only during an insertion or a withdrawal of the printed circuit board.

These and other objects, as well as other advantageous features of the invention will become clear from the following description of preferred embodiments taken in conjunction with the attached drawings in which:

DETAILED DESCRIPTION OF THE PREFERRED EMBODIMENTS

Figure 1:
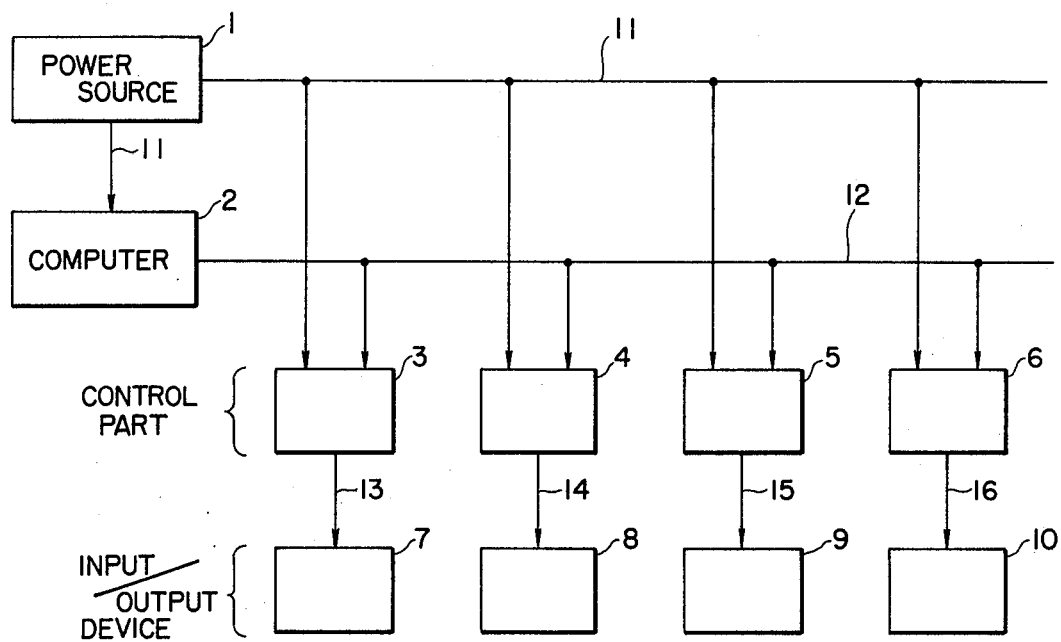
FIG. 1 shows a computor system to which the present invention is to be applied.

Referring at first to FIG. 1 showing an example of a computor system to which the present invention is applicable, control circuits 3 to 6 of a plurality of input means 7 to 10 are concentrated in one or more printed circuit boards.

The printed circuit boards are connected to an input-and-output bus line 12, in parallel with each other, so as to perform transmission and receiving data to and from a computor 2. Electrical power supply is made to respective input-and-output means 3 to 6, from a common power source 1, through a power supplying line 11.

When it is required to increase the number of control circuit, one or more new additional printed circuit board have to be inserted or connected to the bus line 12, while, in case of trouble or for the purpose of maintenance, one or more printed circuit board must be withdrawn.

When a trouble-causing printed circuit board is withdrawn during the access of the computor 1 to other printed circuit board, i.e., without disconnecting the power source 1, a disturbance of signals on the bus-line 12, as well as a fluctuation of the potential at the power line 11, will be derived therefrom, resulting in possible errors in the input-and-output means which are connected to the bus-line 12.

The present invention is to be applied to suh a system for avoiding the described disadvantages.

Figure 2:
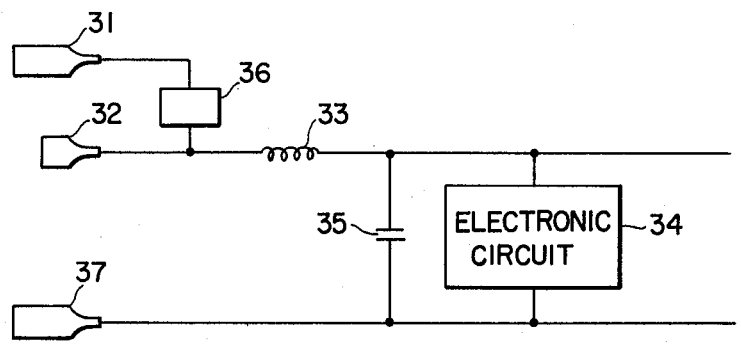
FIG. 2 exemplarily shows a circuit for preventing a source voltage fluctuation due to an insertion of a printed circuit board on ON-LINE status.

Referring to FIG. 2 showing a basic composition of a voltage-fluctuation-prevention circuit, connector plugs for the power supply are designated at numerals 31 and 32, while a numeral 37 denotes a contact plug for ground. Plugs 31 and 37 are of the same length, while the plug 32 is shorter than these two plugs 31 and 37. Because of the difference in length, when the circuit is inserted into a connector (not shown), an electrical contact is made at first by the longer connector plug 31 and subsequently by the shorter connector plug 32. For the same reason, when withdrawn from the connector, the shorter connector plug 32 is at first disengaged, and then is the longer connector contact 31. The ground contact plug 37 having the same length with the longer connector plug 31 is engaged and disengaged synchronously with the latter 31.

The longer connector plug 31 is connected to the shorter connector plug 32 through an impedance element 36, while the shorter connector plug 32 in turn is connected to an electronic circuit 34 through an inductance 33 to supply the circuit with the electric power.

A by-pass capacitor 35 is provided to absorb the fluctuation of power line due to the operation of electronic circuit 34.

As the printed circuit board is inserted to the connector, the longer connector plug 31 is at first connected to the source (not shown), so that a current taken place through the impedance element 36, the inductance 33, to the electronic circuit 34 and to the by-pass capacitor 35.

The inductance 33 is effective to prevent an inrush current, so that the fluctuation of the source voltage is much reduced as designated at a numeral 44, as compared with that 42 of the case where no inductance is provided. (See FIG. 3.)

As the shorter connector plug 32 comes in contact with the power line, a normal and steady power supply is made through the connector plug 32 to the electronic circuit 34.

In a withdrawal of the printed circuit board, the shorter connector plug 32 is at first disengaged.

At this moment, since the longer connector plug still holds the connection with the power line, a current remains through the longer connector plug 31 and the impedance element 36, thereby to avoid an arc at the shorter connector plug 32 and a consequent damage on the latter 32.

Figure 3:
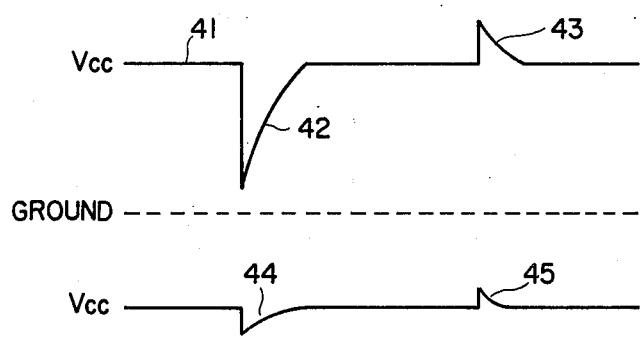
FIG. 3 shows source voltage fluctuations due to an insertion of a printed circuit board on ON-LINE status, when the board is equipped with the fluctuation-prevention circuit and when not equipped with, FIG. 4 shows a circuit for preventing a source voltage fluctuation, which circuit constituting a practical embodiment of the present invention.

Due to the insertion of the impedance element 36, the current reduces correspondingly. Thus, when the longer connector plug 31 is disengaged, only a small electric current is cut, so that the fluctuation of the source voltage decreases as designated at a numeral 45, as compared with that 44 of the case where there is not impedance element 36, as shown in FIG. 3. This advantageously diminishes undesirable effect on other printed circuit boards.

Figure 4:
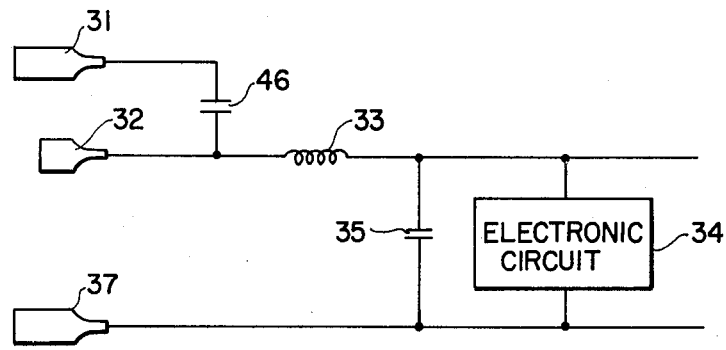

In the embodiment of FIG. 4, the impedance mentioned above is in the form of a capacitor 46. In this arrangement, the same result is obtained with that provided by the foregoing embodiment in the insertion of the printed circuit board. However, in the withdrawal of the printed circuit board, a current is supplied to the electronic circuit 34 through the capacitor 46 and the inductance 33, after the disengagement of the shorter connector plug 32. However, after an elapse of a certain time, the capacitor 46 is charged up to a predetermined voltage and, thereafter, there exists no electrical current. The time required for charging the capacitor 46 is negligibly short for a duration of time with which the withdrawal of the printed circuit board is completed. Thus, when the longer connector plug 31 is disengaged, there no longer remains an electric current, so that no substantial fluctuation of the source voltage takes place.

Although the impedance element 36 may consist of other component than the capacitor, such as a resistance or a resistance connected in series by a capacitor, the capacitor 46 of FIG. 4 can provide a superior effect and, therefore, is preferred.

Figure 5:
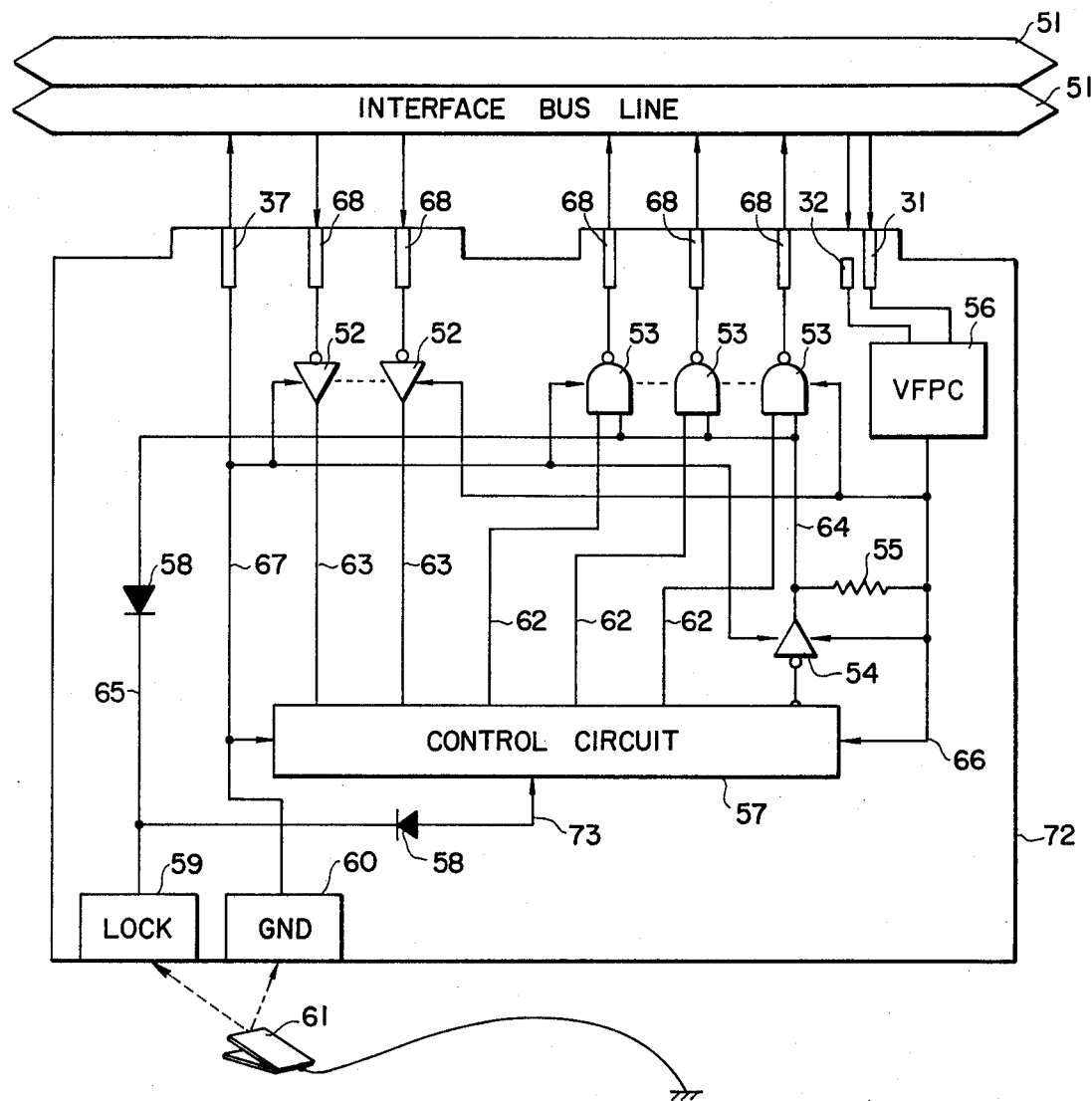
FIG. 5 shows a printed circuit board capable of being withdrawn on ON-LINE state by provision of a ground and a lock terminals, in addition to the fluctuation-prevention-circuit.

FIG. 5 shows a preferred embodiment of the invention in which a printed circuit board is provided with a lock terminal and a grounding terminal, for providing a free insertion-and-withdrawal, in addition to the voltage-fluctuation-prevention circuit. An inter face bus line 51 for grounding signals and the power is connected to connected to a printed circuit board 72, by means of a plurality of signal transmitting plugs 68, a longer and a shorter connector plugs 31, 32 for the power supply and a grounding contact plug 37, respectively.

Input data are put into a control circuit 57, from the bus line 51, through signal transmitting plugs 68, an invertor 52 and a data inputting line 63, while output data are transmitted from the control circuit 57 to the bus line 51, through a data outputting line 52, NAND gate 53 of the open collector and signal transmitting plugs 68. An output control line 64 is connected to one of the terminals of the NAND gate 53, through an open collector invertor 54. A lock terminal 59 is also connected to that terminal through a diode 58. To the lock terminal 59, connected through the diode 58 is a reset line for the control circuit. A voltage-fluctuation-prevention circuit (VFPC) is designated at 56, through which electric power is supplied to each circuit via a power line 66. The power line 66 is connected to the output control line 64 through a resistor 55. A grounding terminal 60 is connected to the bus line 51 through a grounding line 67 and a grounding contact plug 37.

A disturbance will be resulted on the bus line 51, if the NAND gate 53, data outputting line 62 or the output control circut 64 operates erroneously for the fluctuation of power supply at the time of withdrawal on ON-LINE status. In order to avoid this, it is required that the NAND gate 53 is locked for checking the passage of output data 62 and that the control circuits are all reset. The locking line 65 and the reset line 73 are connected to the locking terminal 59 for this purpose.

A safe operation of the control circuit 57 is ensured by stabilizing the grounds of the semiconductors employed in the circuit.

The grounding terminal 60 is provided for preserving the grounding till the end of the withdrawal, thereby to avoid undesirable effect caused by an earlier separation of the grounding contact plug 37 than others, due to a fluctuation, during the withdrawal.

Figure 6:
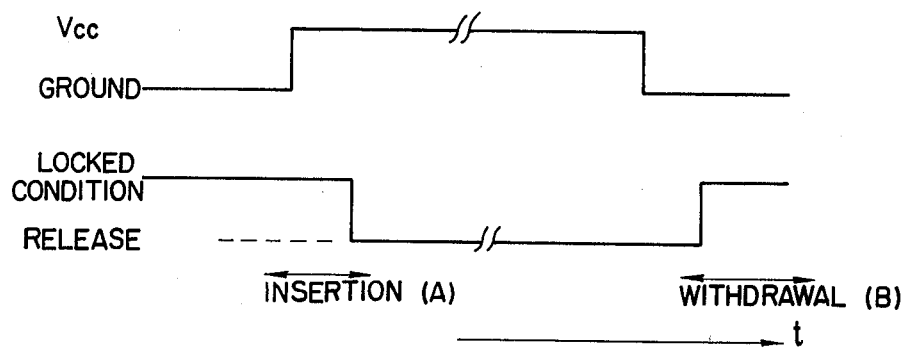
FIG. 6 is a chart showing a time sequence of a lock line and a source line, at the time of withdrawal of a printed circuit board in accordance with the present invention, and, FIG. 7 exemplarily shows a computor system loaded with printed circuit boards in accordance with the present invention.

Referring to FIG. 6 which shows a time chart of an interlocked sequence on ON-LINE withdrawal, between the source power and the locking signal, it is seen that a sequence is necessary for the insertion (A) which allows initially a stable ground level for the printed circuit board and then a rise of the source voltage Vcc under a locked condition and finally the dismissing of the locking signal. For the withdrawal (B), the sequence should be reversed.

To carry out this sequence, the insertion and withdrawal on ON-LINE status of the printed circuit board of FIG. 5 are performed in the following manner. Thus, a conductive grip 61 connected to the ground is used to grip the locking and the grounding terminals 59 and 60 of the printed circuit board 72, at the time of the insertion, thereby to stabilize the ground level on the printed circuit board 72 so as to lock the NAND gate 53. This is for ensuring the resetting of the control circuit when an electrical power comes to be applied thereto. The printed circuit board 72 is then inserted, and, thereafter, the grip 61 is disengaged. The withdrawal can be made in a similar manner. It will be understood that an ON-LINE insertion and withdrawal can fairly be accomplished without causing undesirable effect on the interphase bus line 51.

Figure 7:
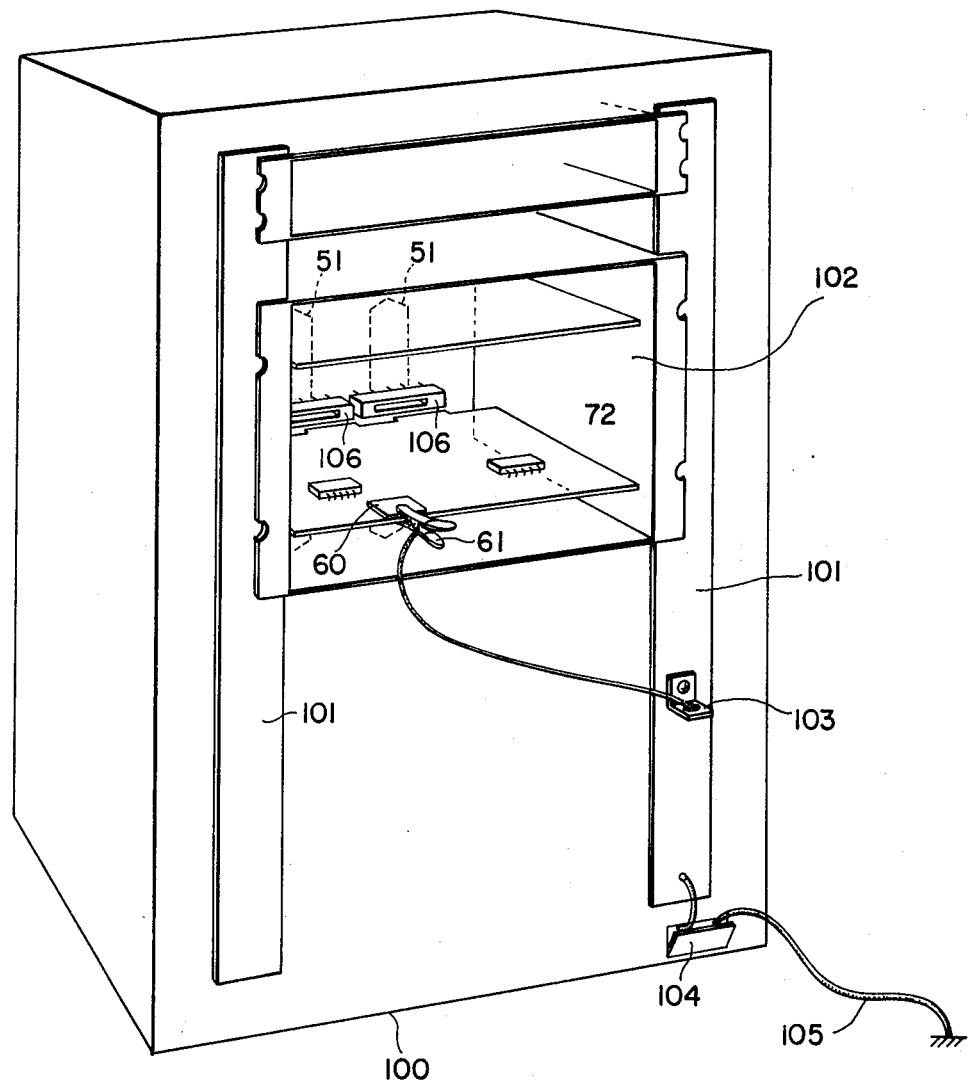

FIG. 7 shows an example of a practical example of a computor in which the printed circuit boards of the present invention are incorporated. In FIG. 7, a reference numeral 100 denotes a housing, 101 a bus for ground, 102 an unit for a printed circuit board, 103 a metal piece for ground, 104 a seat for the grounding terminal, 105 a grounding line and 106 denotes a connector.

The insertion and withdrawal of the printed circuit board 72 to and from the housing 100 is accomplished employing a conductive grip 61 for connecting the grounding terminal 60 and the locking terminal 59 which are located at the back side of the printed circuit board 72. The grip 61 is disengaged after the completion of the insertion or the withdrawal.

From the foregoing description, it will be understood that the insertion and withdrawal on ON-LINE status can be made, by the described construction and through the described manner, without badly affecting other printed circuit boards which are connected to the bus line common to the board in question.

Although specific embodiments have been described with specific terms, various changes and modifications may be imparted thereto without departing from the scope of the invention which is delimited solely by the appended claims.

What is claimed is:

1. A printed circuit board loaded with an electronic circuit characterized by comprising at least two connector plugs for power supply including a first connector plug and a second connector plug, said connector plugs being designed to have a given sequence of connecting and disconnecting to and from an inter face bus line during an insertion and a withdrawal of said printed circuit board to a power line, such that said first connector plug leaves said power line later and gets in contact with said power line earlier than said second connector plug, said first connector plug being connected to said second connector plug through an impedance element, said second connector plug being connected through an inductance element to said electronic circuit for a power supply to the latter.

2. A printed circuit board as claimed in claim 1, wherein said impedance element is constituted by a capacitor.

3. A printed circuit board as claimed in claim 1 characterized by comprising a grounding terminal connected to a ground line of said electronic circuit and a locking terminal connected by a locking line for a signal from a final stage of said electronic circuit and by a reset line for a control circuit, said grounding terminal and said locking terminal being adapted to be electrically connected to the ground during said insertion and withdrawal of said printed circuit board.

4. A printed circuit board as claimed in claim 3, wherein an output control line is connected to a final gate for data outputting through an open collector gate, said open collector gate having an output terminal to which connected is a lock line through a diode.

5. A printed circuit board as claimed in claim 3, wherein said reset line for said control circuit is connected to a locking line through a diode.

6. A printed circuit board as claimed in claim 3, characterized in that said grounding terminal and said locking terminal are located at an end portion of said printed circuit board in a close proximity to each other, and that said grounding terminal and said locking terminal are adapted to be gripped together by a conductive grip for electrical contact with each other during said insertion and said withdrawal.

* * * * *